(12) United States Patent
He

(10) Patent No.: US 10,665,763 B2
(45) Date of Patent: May 26, 2020

(54) EQUIPMENT SYSTEM USING THERMOPLASTIC RESIN PHOTOCONVERTER TO BOND-PACKAGE LED BY ROLLING

(71) Applicant: Jiangsu Cherrity Optronics Co., Ltd., Jiangning, Nanjing (CN)

(72) Inventor: Jinhua He, Jiangning Nanjing (CN)

(73) Assignee: Jiangsu Cherrity Optronics Co., Ltd., Jiangning, Nanjing (CN)

( * ) Notice: Subject to any disclaimer, the term of this patent is extended or adjusted under 35 U.S.C. 154(b) by 88 days.

(21) Appl. No.: 15/750,790

(22) PCT Filed: Dec. 16, 2015

(86) PCT No.: PCT/CN2015/097626
§ 371 (c)(1),
(2) Date: Feb. 6, 2018

(87) PCT Pub. No.: WO2017/028418
PCT Pub. Date: Feb. 23, 2017

(65) Prior Publication Data
US 2018/0248085 A1    Aug. 30, 2018

(30) Foreign Application Priority Data

Aug. 18, 2015   (CN) .......................... 2015 1 0509656

(51) Int. Cl.
*H01L 33/50*    (2010.01)
*H01L 33/64*    (2010.01)
(Continued)

(52) U.S. Cl.
CPC .......... *H01L 33/505* (2013.01); *B29C 43/222* (2013.01); *B29C 43/28* (2013.01);
(Continued)

(58) Field of Classification Search
CPC ..................................................... H01L 33/501
See application file for complete search history.

(56) References Cited

U.S. PATENT DOCUMENTS

| | | | | |
|---|---|---|---|---|
| 2005/0008821 | A1* | 1/2005 | Pricone ................. | B29C 33/424 428/131 |
| 2006/0270236 | A1* | 11/2006 | Kusumoto .......... | H01L 27/1266 438/692 |
| 2010/0311579 | A1* | 12/2010 | Koga .................... | G06K 19/083 503/200 |

FOREIGN PATENT DOCUMENTS

| | | |
|---|---|---|
| CN | 101872828 A | 10/2010 |
| CN | 103531691 A | 1/2014 |

(Continued)

OTHER PUBLICATIONS

State Intellectual Property Office of the P.R. China, International Search Report for PCT/CN2015/097626, dated May 16, 2016, 3 pp.

*Primary Examiner* — Julio J Maldonado
*Assistant Examiner* — Omar F Mojaddedi
(74) *Attorney, Agent, or Firm* — Edwin S. Flores; Chalker Flores, LLP

(57) ABSTRACT

An equipment system for bond-packaging an LED using a thermoplastic resin photoconverter by rolling includes: a cooperative roll-shaping and roll-cutting apparatus used for performing roll-shaping and roll-cutting on a photoconversion sheet, to form a photoconversion sheet array; and a roll-bonding apparatus used for performing roll-bonding on the photoconversion sheet array and a flip chip LED array. The cooperative roll-shaping and roll-cutting apparatus and the roll-bonding apparatus are arranged sequentially to form cooperatively linked process equipment, where the cooperative roll-shaping and roll-cutting apparatus includes a first rolling device with a protrusion array and a second rolling device with a recess array that are disposed face-to-face and (Continued)

aligned with each other, and the roll-bonding apparatus includes a fourth rolling device with a recess array and a third rolling device with a smooth rolling surface that are disposed face-to-face and aligned with each other.

15 Claims, 17 Drawing Sheets

(51) Int. Cl.
*B29C 43/22* (2006.01)
*B29C 43/28* (2006.01)
*B29C 43/46* (2006.01)

(52) U.S. Cl.
CPC ............ *B29C 43/46* (2013.01); *H01L 33/501* (2013.01); *H01L 33/64* (2013.01); *B29C 2043/464* (2013.01); *H01L 2933/0041* (2013.01)

(56) References Cited

FOREIGN PATENT DOCUMENTS

| CN | 104321888 A | 1/2015 |
|----|-------------|--------|
| GB | 997071 A | 1/1964 |
| WO | 2017028418 A1 | 2/2017 |

* cited by examiner

EQUIPMENT SYSTEM USING THERMOPLASTIC RESIN PHOTOCONVERTER TO BOND-PACKAGE LED BY ROLLING

CROSS-REFERENCE TO RELATED APPLICATIONS

This application is the National Stage of International Application No. PCT/CN2015/097626, filed on Dec. 16, 2015 claiming the priority of CN 201510509656.0, filed on Aug. 18, 2015, the content of each of which is incorporated by reference herein.

BACKGROUND OF THE INVENTION

Technical Field

The present invention relates to the technical field of LED packaging equipment, and in particular, to an equipment system for bond-packaging an LED using a thermoplastic resin photoconverter by rolling.

Background

With the advantages such as high brightness, low heat, long service life, and being environmentally friendly and renewable, LEDs are known as the most promising new generation of green light sources in the $21^{st}$ century. At present, the theoretical service life of the LED can be over 100,000 hours. However, during actual application, limited by many factors such as chip failure, package failure, thermal overstress failure, electrical overstress failure, and/or assembly failure, especially limited by the package failure, the LED prematurely encounters luminous decay or loss of luminous efficacy, thus hindering development of the LED to be a novel energy-saving light source. To solve these problems, many scholars in the field have carried out related researches, and have proposed some improvement measures to enhance luminous efficacy and actual service life of the LED For example, flip-chip LED packaging is developed in recent years. Compared with conventional LED upright packaging, this flip-chip manner has such advantages as high luminous efficacy, high reliability, and easy integration. This manner also greatly saves packaging materials. For example, materials such as a gold wire, die bonding glue, and a support that are used in the conventional LED upright packaging are no longer needed. Further, this manner greatly simplifies a packaging process. For example, die bonding, wire soldering, and even light splitting in the conventional LED upright packaging are no longer needed. In this way, the LED flip-chip packaging is increasingly widely applied. However, it should also be noted that, the existing flip-chip LED packaging technologies mostly bond a photoconverter made of an organic silicone resin to a flip chip LED by using a casting process, a screen printing process, an upper and lower flat plate molding process, a single roller pressing process, and the like. These processes and matched packaging equipment cannot desirably solve flaws such as pores and unequal thickness of the photoconverter made of the organic silicone resin, thus causing a low yield of the LEDs packaged by using a photoconverter. In addition, due to low production efficiency, the high product costs cannot be reduced.

Chinese patent application NO. 201010204860.9 discloses a "flip-chip LED packaging method", which includes steps of: (a) coating a surface of an LED chip with a photoconverter through screen printing, and baking the photoconverter to cure the photoconverter; (b) fixing the LED chip on a chip substrate, such that electrodes of the LED chip and electrodes of the chip substrate are bonded; (c) fixing the LED chip and the chip substrate to the bottom of a reflector cup on a support; (d) separately connecting positive and negative electrodes of the fixed chip substrate to positive and negative electrodes of the support by using wires; (e) placing a sealing mold or lens cover on the support on which the LED chip and the chip substrate are fixed, and filling the sealing mold or lens cover with silica gel; and (f) baking a whole structure to cure it. This method uses the screen printing process to enhance uniformity of coating thickness of the photoconverter and enhance distribution uniformity of fluorescent powder particles, so as to improve the yield. However, there exist the following obvious defects: First, after the surface of the LED chip is coated with the photoconverter made of the organic silicone resin through a screen printing process, due to thermal overstress in a subsequent baking and curing procedure, pores still occur in part of the photoconverter coating and the coated surface of the LED chip, thus forming sags and crests. Secondly, after the sealing mode or lens cover is filled with the silica gel and packaged together with the photoconverter-coated LED chip, due to thermal overstress in the subsequent procedure of baking and curing the whole structure, pores still occur in part of the silica gel layer on the sealing mold or lens cover, thus forming sags and crests. Because the thermal overstress impact on the LED chip cannot be resolved in the packaging procedure, LED luminous efficacy is reduced inevitably. Thirdly, no intelligent control system is equipped to control the whole LED chip packaging process, which directly affects improvement of the yield.

Chinese patent application NO, 201310270747.4 discloses an "LED coated with photoconverter layer, manufacturing method for same, and LED device". This solution includes: an LED configuration stage, in which an LED is configured on a surface of a support chip in a through-thickness direction; a layer configuration stage, in which a photoconverter layer is configured on a surface of the support chip in the through-thickness direction in the same manner as LED configuration, the photoconverter layer being formed by active energy ray cured resin which is cured by irradiation with an active energy ray and a fluorescent resin composition of the photoconverter; a curing stage, in which the photoconverter layer is irradiated with an active energy ray to cure the photoconverter layer; a cutting stage, in which the photoconverter layer is cut corresponding to the LED, to obtain an LED coated with the photoconverter layer; and an LED separation stage, in which the LED coated with the photoconverter layer is separated from the support chip after the cutting process. This method aims to offer a solution to uniform configuration of photoconverters around the LED to avoid damage, thus obtaining an LED coated with a photoconverter layer, and an LED device having the LED coated with the photoconverter layer. However, there exist the following obvious defects: First, in a curing procedure of the fluorescent resin composition of the photoconverter, due to thermal overstress, pores still occur in part of the photoconverter surface layer, thus forming sags and crests. Secondly, the LED coated with the photoconverter layer is still affected by the thermal overstress, causing a decrease in luminous efficacy of the LED in use. Thirdly, the stages of the whole packaging process are complicated, causing low production efficiency of LED packages. Fourthly, an upper and lower flat plate molding process may cause displacement of a flip chip, no intelligent control system for precise control is provided, thus inevitably reducing the yield.

Chinese patent application NO. 201380027218.X discloses a "resin sheet laminate, and manufacturing method for semiconductor light-emitting element using same". In this solution, the resin sheet laminate is formed by disposing a fluorophor-containing resin layer on a substrate, where the fluorophor-containing resin layer has multiple regions, the substrate has a lengthwise direction and a transverse direction, and the multiple regions are arranged along the lengthwise direction repeatedly to form columns. By using the resin sheet laminate, this solution aims to enhance uniformity of color and brightness of a semiconductor light-emitting element to which the fluorophor-containing resin layer is attached, and make it easy to manufacture and free to design the element. However, there exist the following obvious defects: First, the used fluorescent resin sheet is a cured fluorescent resin sheet, and therefore, possible residual pores, sags and crests, or other flaws produced during processing cannot be effectively eliminated. Secondly, in a bonding stage, a pressure is exerted by a pressurizing tool from a side of the semiconductor light-emitting element, which may damage the semiconductor light-emitting element. Thirdly, in the bonding stage using an adhesive in the fluorophor-containing resin layer, it is difficult to eliminate residuals from the semiconductor light-emitting element after bonding, and pores easily occur in the bonding procedure, thus reducing the yield; in addition, existence of the bonding layer reduces light emission efficiency of the LED element. Fourthly, the substrate under the fluorescent resin sheet bonded to the light emitting surface of the semiconductor light-emitting element is not removed, which directly affects luminous efficacy of the semiconductor light-emitting element. Fifthly, the multiple regions of the fluorophor-containing resin layer are arranged in the lengthwise direction repeatedly to form columns, but actually it is complex to arrange the multiple regions of the fluorophor-containing resin layer in such a manner, thus affecting the packaging efficiency of the whole element. An error in arrangement positions of the multiple regions directly affects the precision of subsequent bonding with the light-emitting element. If the multiple regions cannot be rendered uniform in size and thickness, a severe problem of product inconsistency may emerge.

To sum up, nowadays, how to overcome the defects in the prior art has become one of major difficulties to be solved urgently in the technical field of LED packaging equipment using a photoconverter.

SUMMARY OF THE INVENTION

An objective of the present invention is to overcome the defects in the prior art and provide an equipment system for bond-packaging, an LED using a thermoplastic resin photoconverter by rolling. The present invention has a significant advantage of bond-packaging the LED by continuous rolling, can meet a requirement of a process for bond-packaging an LED using a thermoplastic resin photoconverter and enhance the production efficiency and yield of LED packages in industrialized batch production.

The present invention is a branch technical solution of a process for bond-packaging an LED using a thermoplastic resin photoconverter by rolling provided by the applicants of the present invention.

The present invention provides an equipment system for bond packaging an LED using a thermoplastic resin photoconverter by rolling, which includes: a cooperative roll-shaping and roll-cutting apparatus used for performing roll-shaping and roll-cutting on a photoconversion sheet, to form a photoconversion sheet array; and a roll-bonding apparatus used for performing roll-bonding on the photoconversion sheet array and a flip chip LED array. The cooperative roll-shaping and roll-cutting apparatus and the roll-bonding apparatus are arranged sequentially to form cooperatively linked process equipment, where the cooperative roll-shaping and roll-cutting apparatus includes a first rolling device with a protrusion array and a second rolling device with a recess array that are disposed face-to-face and aligned with each other, and the roll-bonding apparatus includes a fourth rolling device with a recess array and a third rolling device with a smooth rolling surface that are disposed face-to-face and aligned with each other.

An implementation principle of the present invention is as follows: To better solve the problems in the existing flip chip LED packaging process, the present invention subtly designs an equipment system for bond-packaging an LED using a thermoplastic resin photoconverter by rolling. A principle of bond-packaging by rolling of the present invention is as follows: On one hand, in a vacuum condition, a roller is used to perform rolling on a thermoplastic resin photoconversion sheet so that a plastic flow occurs in sags and crests in the sheet to eliminate possible residual pores, sags and crests, or other flaws produced during processing in the photoconversion sheet, thereby obtaining a flat refined photoconversion sheet without pores and having uniform thickness. On the other hand, the rolled thermoplastic resin photoconversion sheet can be plastically deformed during processing, to form a photoconverter light emitting surface in a required optimal shape, such as a cambered surface, a hemispheric surface, or a planar surface, thus improving the light emission efficiency and light emission uniformity of LED package elements. Moreover, the present invention provides cooperatively linked process equipment sequentially formed according to a process flow of for bond-packaging an LED using a thermoplastic resin photoconverter by rolling. Therefore, processing conditions of batch production of LED package elements are met, and uniformity in specifications and dimensions is ensured. In this way, the production efficiency of the LED package elements can be enhanced, and moreover, uniformity of brightness and color of finished LED package elements is improved, so that the yield is greatly improved.

The present invention has the following remarkable advantages in comparison with the prior art:

First, the equipment system provided by the present invention has a significant advantage of a novel process of bond-packaging an LED using a thermoplastic resin photoconverter by rolling, which solves the problems of low light emission efficiency, a low yield, and low production efficiency of LED bond-packaging by using equipment for conventional processes such as a casting process, a screen printing process, an upper and lower flat plate molding process, a single roller pressing process, and the like. The present invention can meet a requirement of a continuous process flow of bond-packaging an LED using a thermoplastic resin photoconverter by rolling, and enhance the production efficiency and yield of industrialized LED packaging in batches.

Secondly, the equipment system provided by the present invention can effectively eliminate possible residual pores, sags and crests, or other flaws produced during processing in the photoconversion sheet, thus significantly improving uniformity of brightness and color of finished LED package elements. The yield of the LED package elements manufactured by using the present invention is obviously higher than that of an existing product of the same kind.

Thirdly, the process equipment provided by the present invention, which is used for performing roll-shaping and roll-cutting on the photoconversion sheet array and bond-packaging a flip chip LED array by rolling to form LED package elements, includes multiple optional implementation solutions. Thus, the defects in the prior art can be overcome, and further the light emission efficiency and light emission uniformity of finished LED package elements are significantly enhanced. In addition, it is suitable to equip an equipment system for implementing a continuous process and to carry out intelligent control, so as to meet a production requirement of industrialized LED packaging in batches. In this way, the production efficiency of industrialized LED packaging in batches is remarkably improved, uniformity of brightness and color of finished LED package elements is greatly improved, and a light splitting stage in a conventional LED packaging process can be abolished.

Fourthly, the equipment system provided by the present invention is widely applicable to a roll-packaging process implemented by bonding a thermoplastic resin photoconverter to LED clip chips of different power, thus completely meeting a requirement of refining the product production process during industrialized LED packaging in batches.

Figure 1:
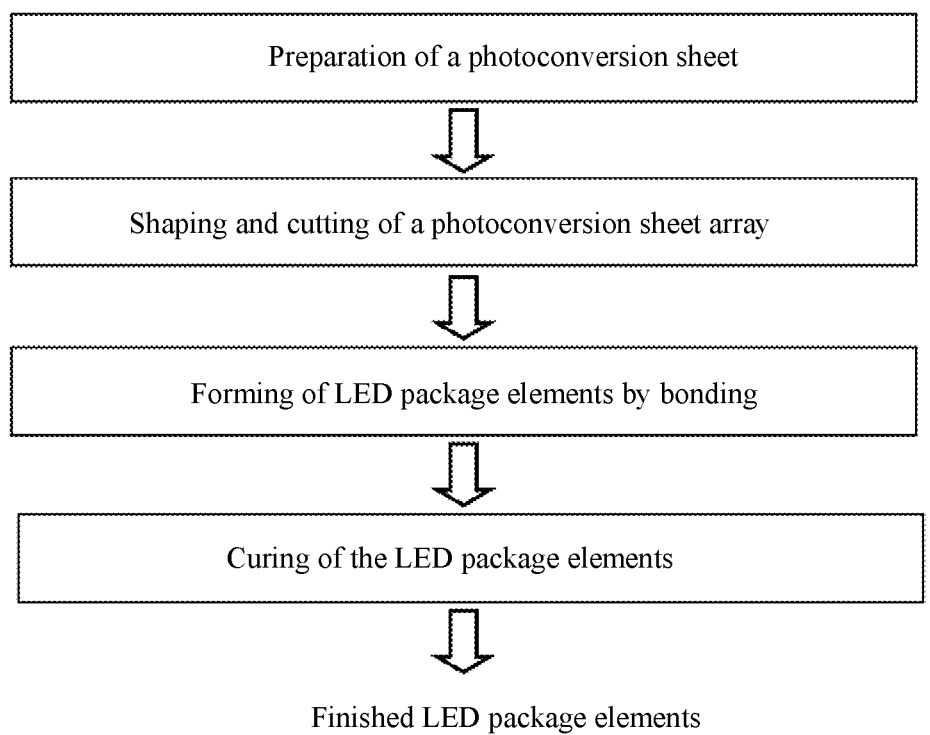
FIG. 1 is a schematic block diagram of procedures of a process for bond-packaging an LED using a thermoplastic resin photoconverter by rolling, to which an equipment system of the present invention is applied.
Figure 2:
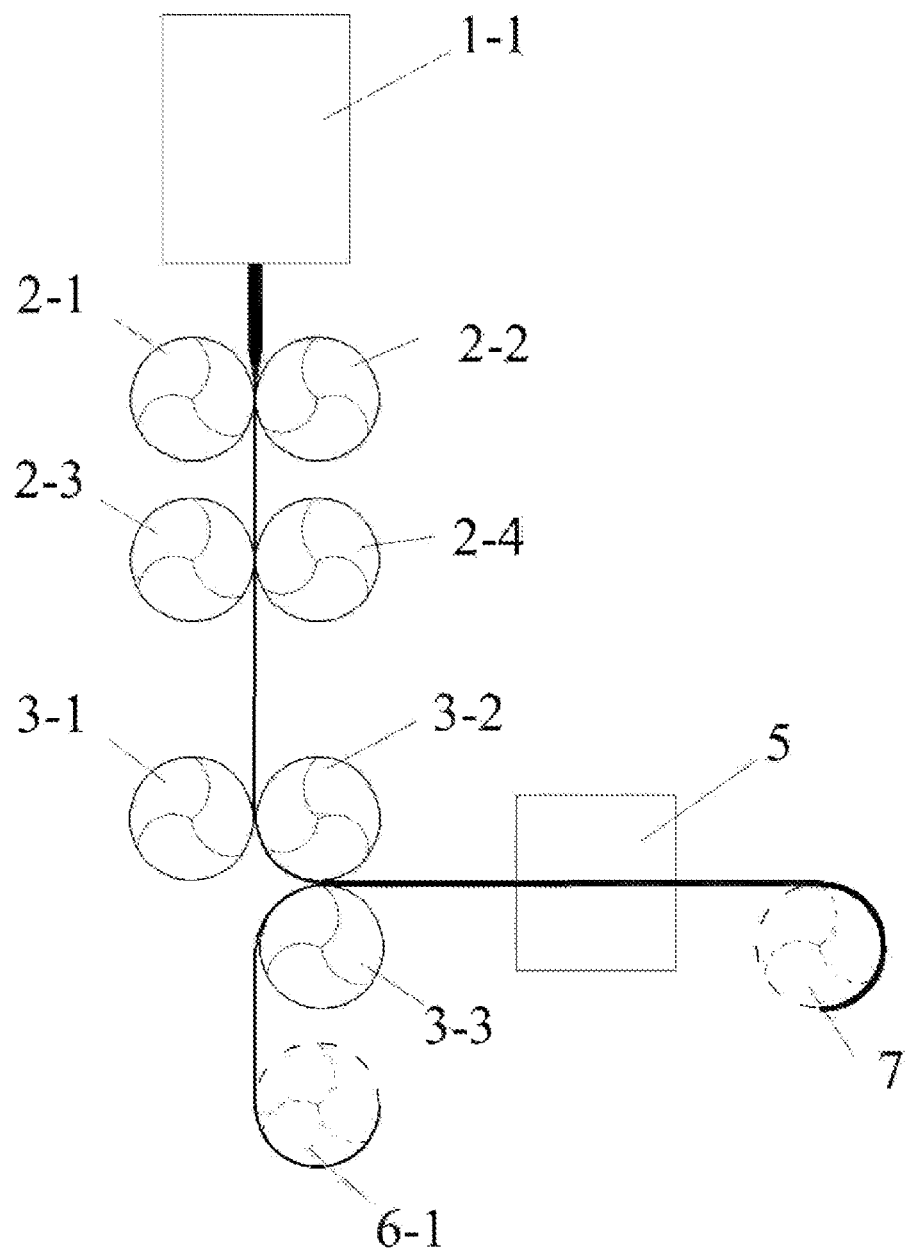
FIG. 2 is a schematic structural diagram of a first flow layout of an equipment system for bond-packaging an LED using a thermoplastic resin photoconverter by rolling according to the present invention.
Figure 3:
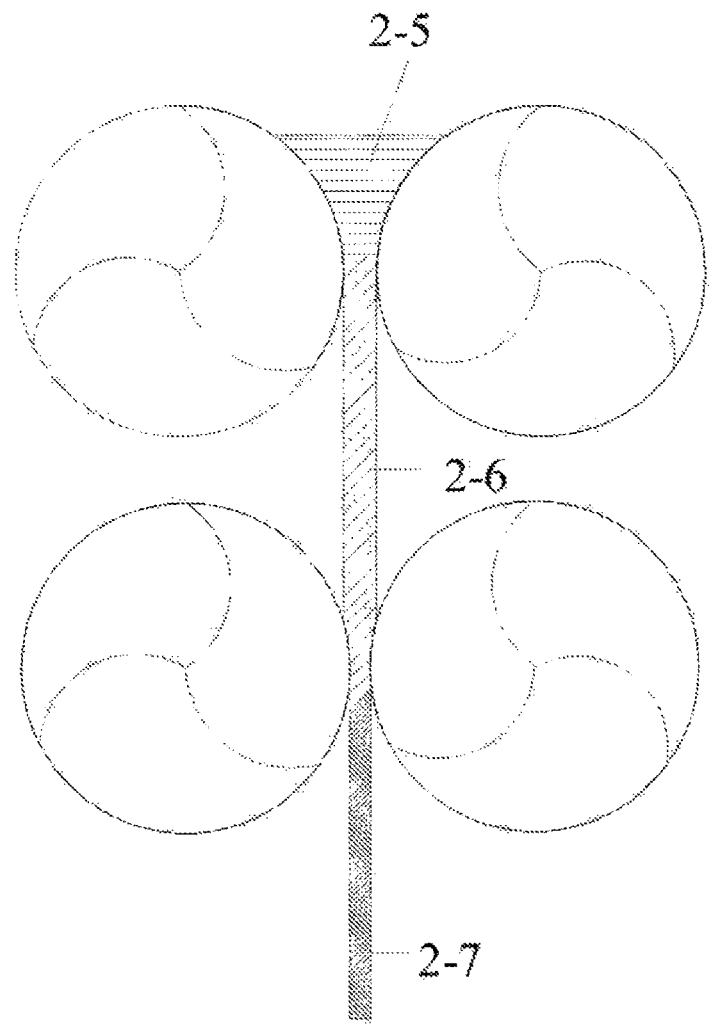
FIG. 3 is a schematic structural diagram of a double-roller roll-laminating apparatus for preparing a photoconversion sheet in the schematic structural diagram of the first flow layout shown in FIG. 2.
Figure 4:
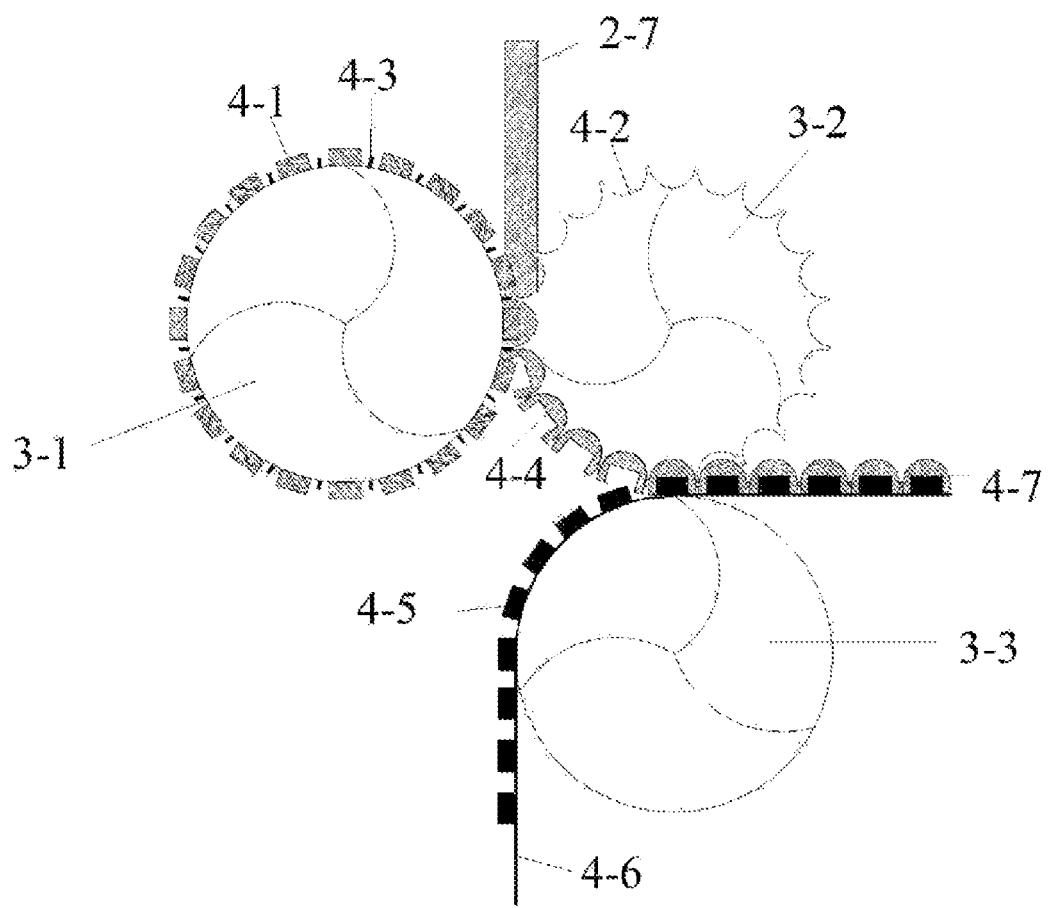
FIG. 4 is a schematic structural diagram of a cooperative roll-shaping and roll-cutting apparatus used for performing roll-shaping and roll-cutting on a photoconversion sheet and a roll-bonding apparatus used for performing roll-bonding on the photoconversion sheet array and a flip chip LED array in the schematic structural diagram of the first flow layout shown in FIG. 2.
Figure 6:
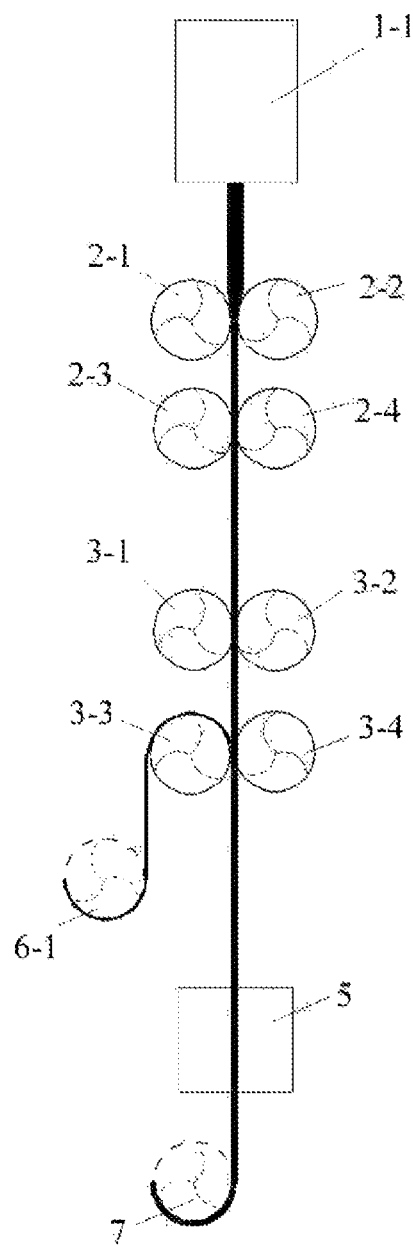
Figure 7:
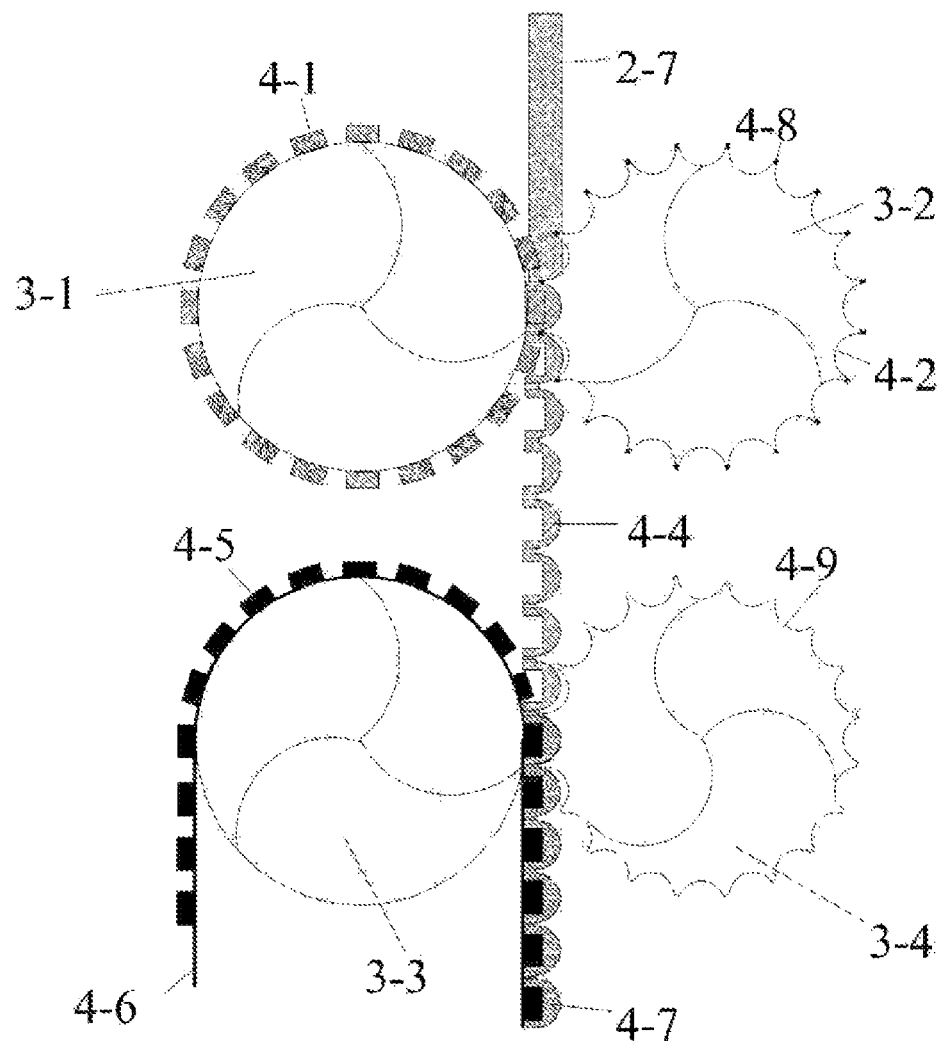
Figure 8:
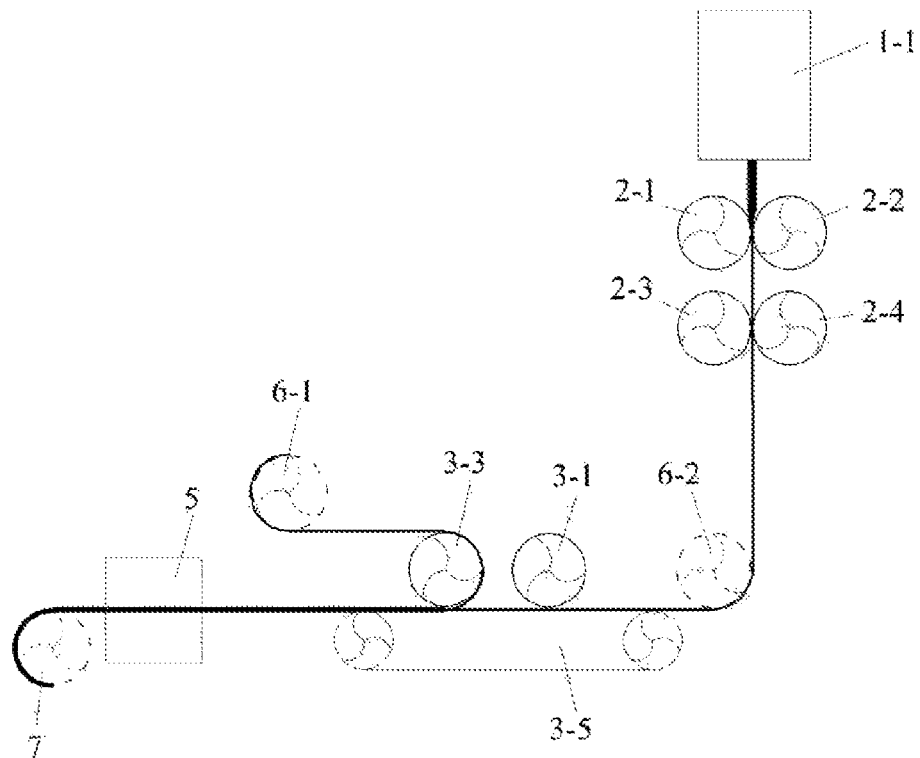
Figure 9:
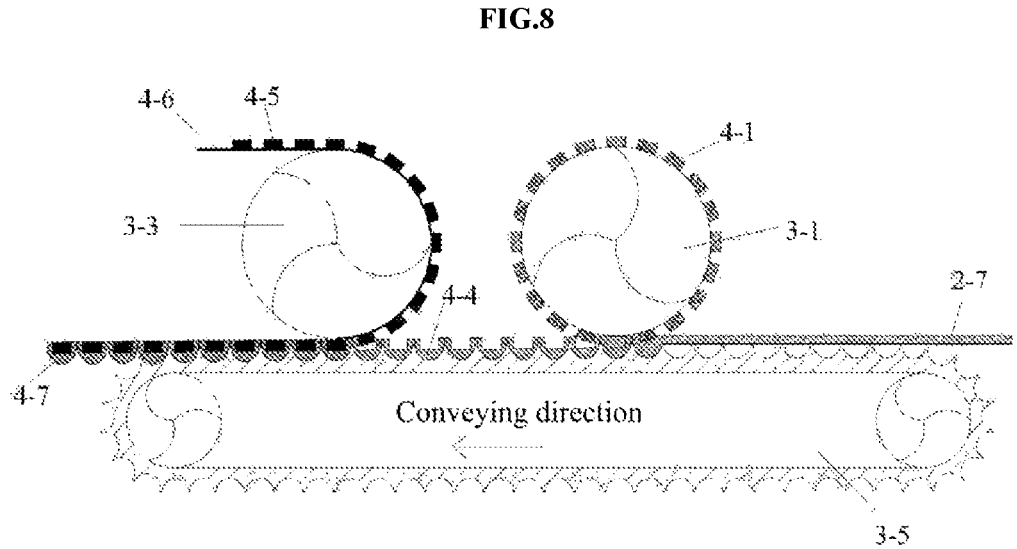
Figure 10:
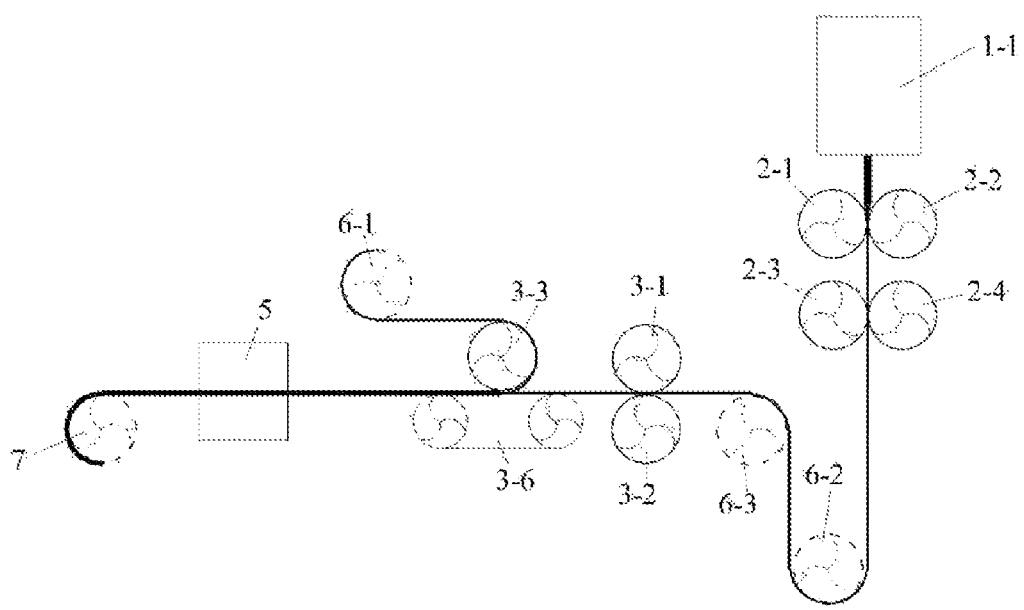
Figure 11A:
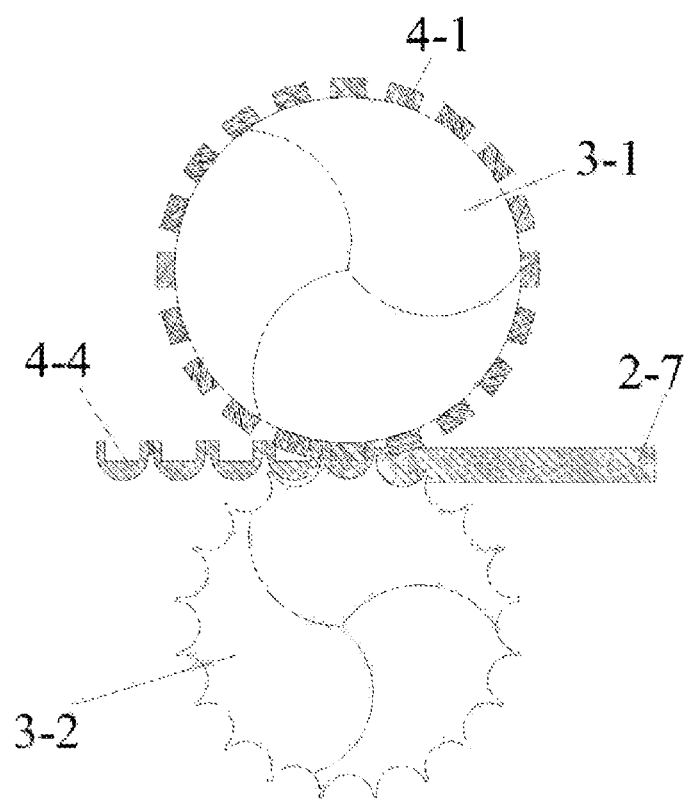
Figure 11B:
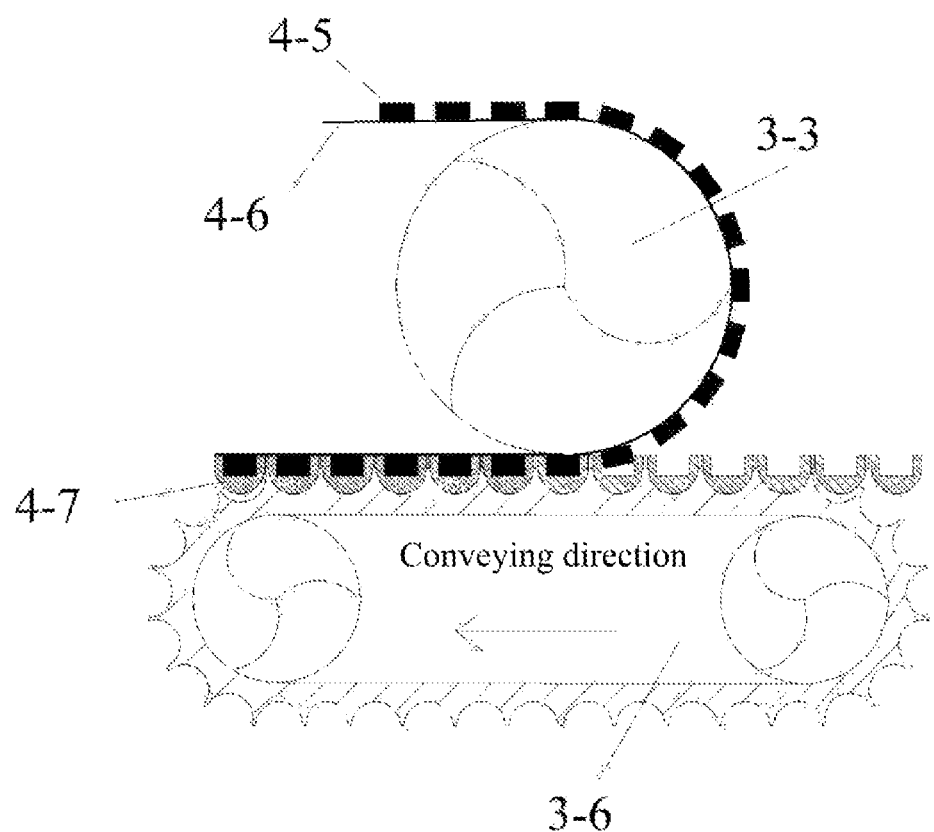
Figure 12A:
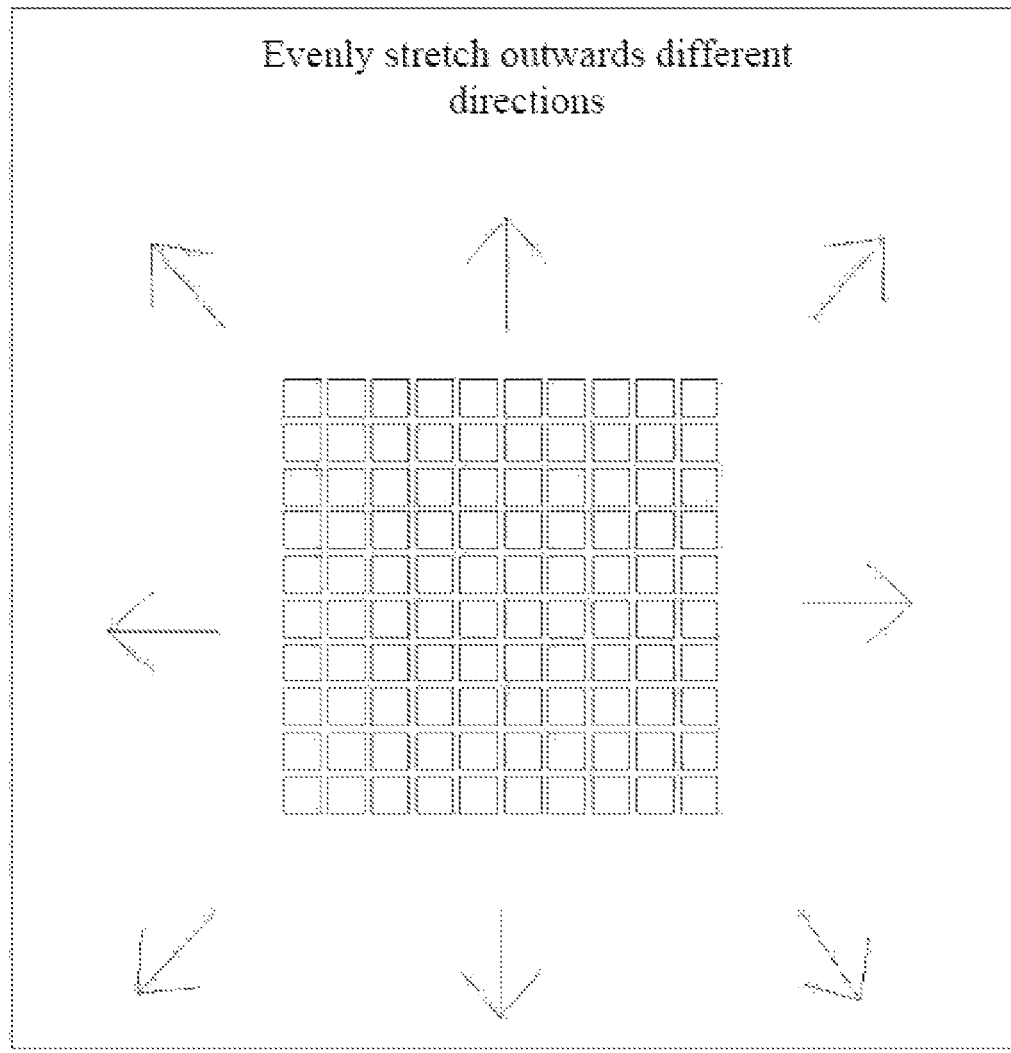
Figure 12B:
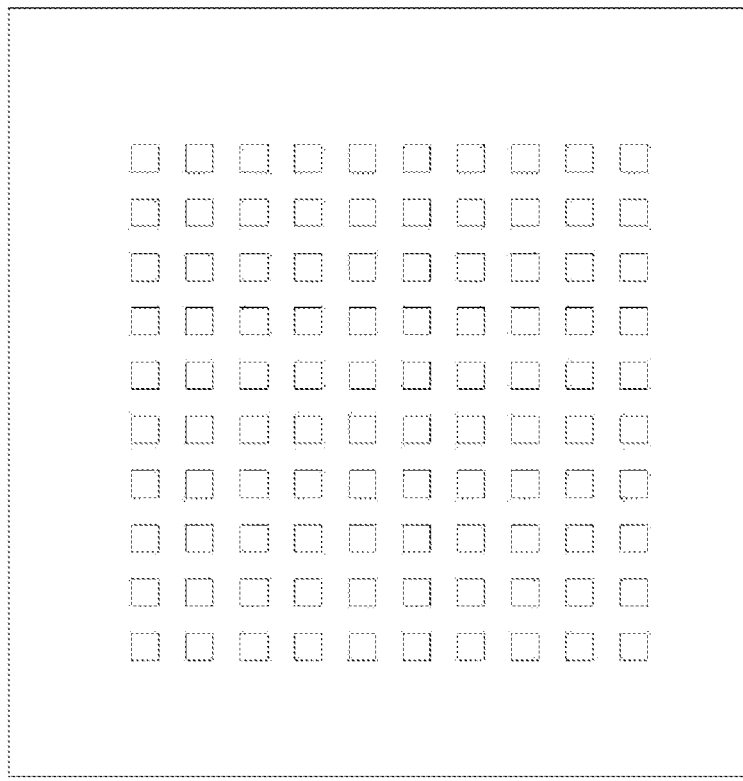
Figure 13A:
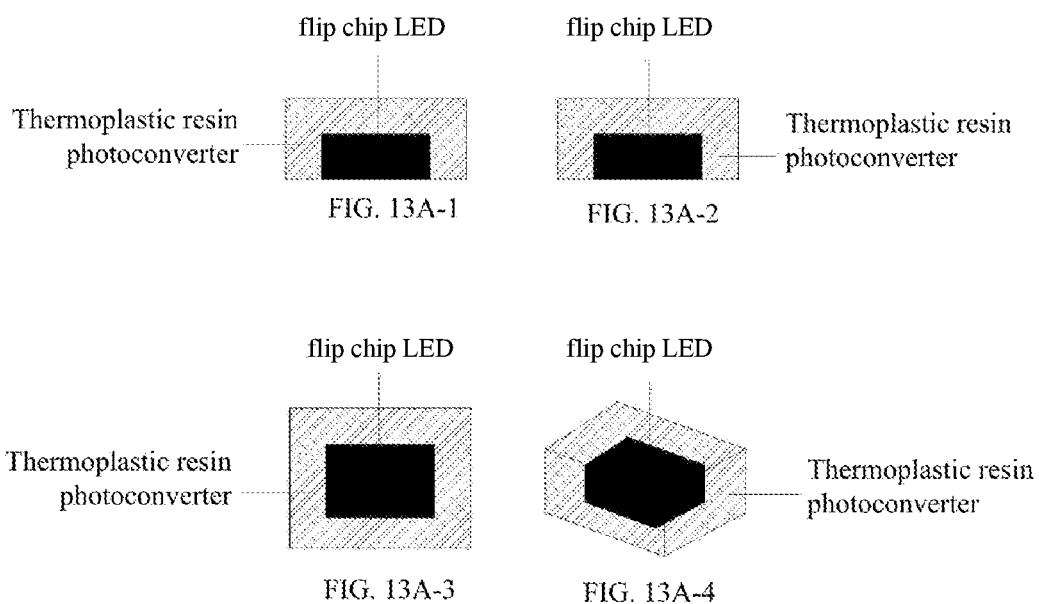
Figure 13B:
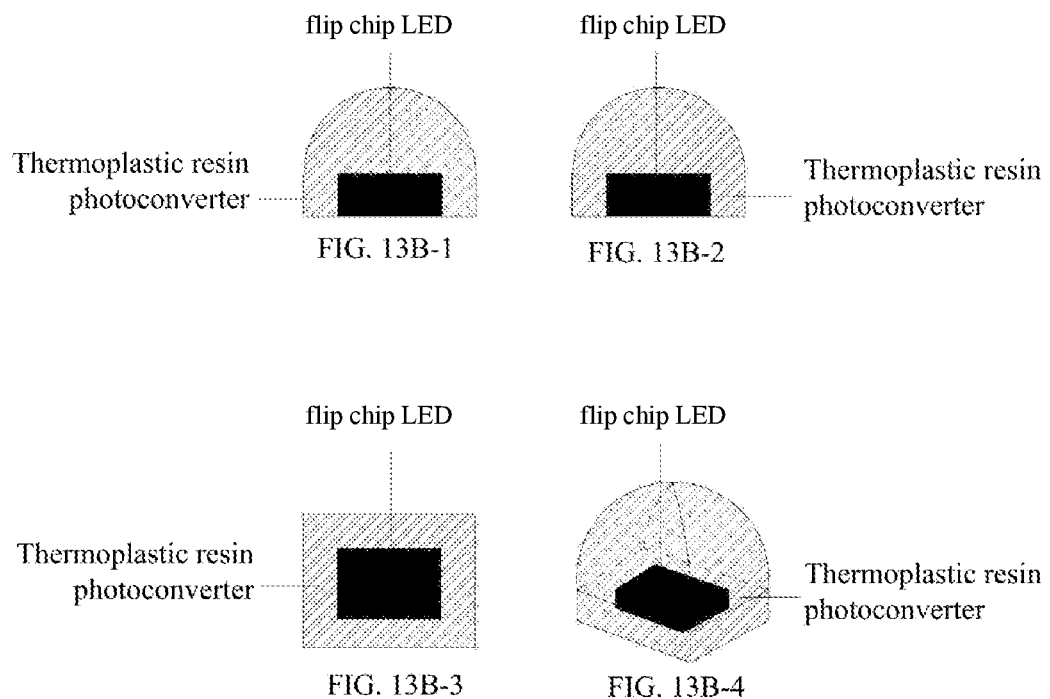
Figure 13C:
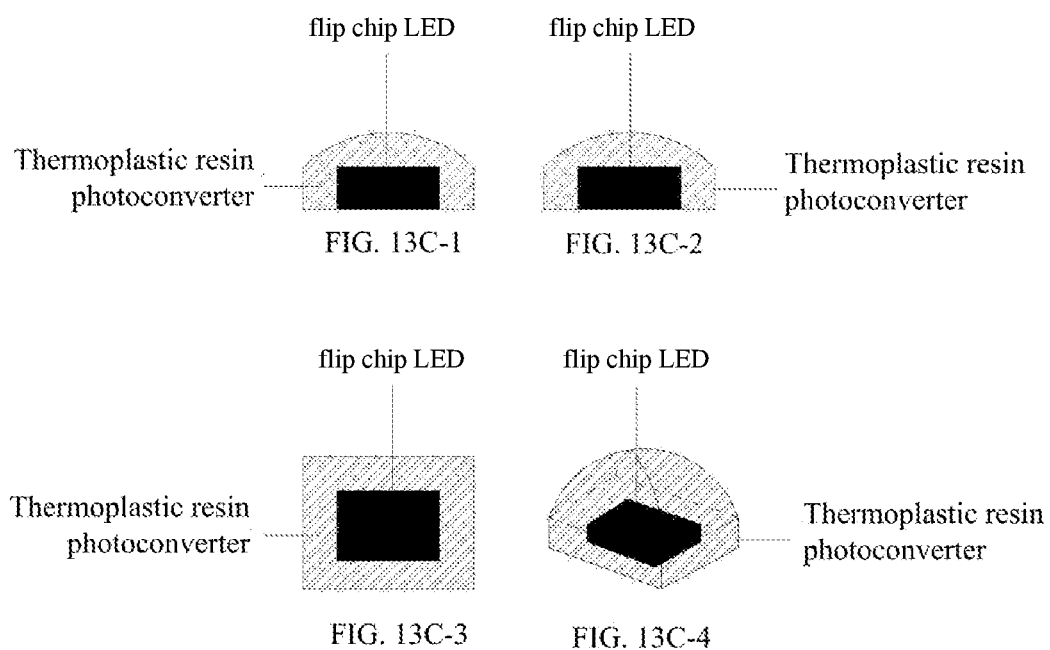

FIG. SB is a schematic structural diagram of a cutting manner 2 in shaping and cutting of the photoconversion sheet array in the schematic structural diagram of the first flow layout shown in FIG. 2;

FIG. 6 is a schematic structural diagram of a second flow layout of the equipment system for bond-packaging an LED using a thermoplastic resin photoconverter by rolling according to the present invention;

FIG. 7 is a schematic structural diagram of a cooperative roll-shaping and roll-cutting apparatus used for performing roll-shaping and roll-cutting on a photoconversion sheet and a roll-bonding apparatus used for performing roll-bonding on the photoconversion sheet array and a flip chip LED array in the schematic structural diagram of the second flow layout shown in FIG. 6;

FIG. 8 is a schematic structural diagram of a third flow layout of the equipment system for bond-packaging an LED using a thermoplastic resin photoconverter by rolling according to the present invention;

FIG. 9 is a schematic structural diagram of a cooperative roll-shaping and roll-cutting apparatus used for performing roll-shaping and roll-cutting on a photoconversion sheet and a roll-bonding apparatus used for performing roll-bonding on the photoconversion sheet array and a flip chip LED array in the schematic structural diagram of the third flow layout shown in FIG. 8;

FIG. 10 is a schematic structural diagram of a fourth flow layout of the equipment system for bond-packaging an LED using a thermoplastic resin photoconverter by rolling according to the present invention;

FIG. 11A is a schematic structural diagram of an apparatus for shaping and cutting a photoconversion sheet array in the schematic structural diagram of the fourth flow layout shown in FIG. 10;

FIG. 11B is a schematic structural diagram of an apparatus for bonding the shaped and cut photoconversion sheet array to a flip chip LED in the schematic structural diagram of the fourth flow layout shown in FIG. 10;

FIG. 12A is a schematic planar structural diagram of finished LED package elements manufactured by using the equipment system of the present invention;

FIG. 12B is a schematic planar structural diagram of the finished individual LED package elements manufactured by using the equipment system of the present invention;

FIG. 13A is a schematic structural diagram of cambered surface-shaped LED package element manufactured by using the equipment system of the present invention, where FIG. 13A-1 is a left view, FIG. 13A-2 is a right view, FIG. 13A-3 is a bottom view, and FIG. 13A-4 is a three-dimensional view;

FIG. 13B is a schematic structural diagram of a hemispheric surface-shaped LED package element manufactured by using the equipment system of the present invention, where FIG. 13E-1 is a left view, FIG. 13B-2 is a right view, FIG. 13B-3 is a bottom view, and FIG. 13B-4 is a three-dimensional view; and FIG. 13C is a schematic structural diagram of a planar surface-shaped LED package element manufactured by the equipment system of the present invention, where FIG. 13C-1 is a left view, FIG. 13C-2 is a right view, FIG. 13C-3 is a bottom view, and FIG. 13C-4 is a three-dimensional view.

Meaning of numerals in the accompanying drawings of the present invention:

1-1 Melting and blending apparatus
2-1 and 2-2 Two smooth-surface single-wheeled rollers each having a smooth rolling surface of a first smooth-surface double-roller roll laminator
2-3 and 2-4 Two smooth-surface single-wheeled rollers each having a smooth rolling surface of a second smooth-surface double-roller roll laminator
2-5 Mixed slurry
2-6 Rough photoconversion sheet
2-7 Refined photoconversion sheet
3-1 First single-wheeled roller with a protrusion array
3-2 Second single-wheeled roller with a recess array
3-3 Third single-wheeled roller with a smooth surface
3-4 Fourth single-wheeled roller with a recess array
3-5 Second planar conveyor with a recess array
3-6 Fourth planar conveyor with a recess array
4-1 Protrusion on the first single-wheeled roller
4-2 Recess on the second single-wheeled roller 4-3 Cutter on the periphery with protrusions
4-4 Photoconversion sheet with recesses
4-5 flip chip LED
4-6 Carrier film
4-7 LED package element
4-S Cutter on the rims of recesses
4-9 Recess on a fourth single-wheeled roller
5 Curing apparatus
5-1 flip chip LED buffer roller
6-2 First buffer roller
6-3 Second buffer roller
7 Wind-up roller

DETAILED DESCRIPTION OF THE INVENTION

Specific implementations of the present invention are described in detail below with reference to the accompanying drawings and embodiments.

Embodiment 1: As shown in FIGS. 1, 2, 6, 8, and 10, the present invention provides an equipment system for bond-packaging an LED using a thermoplastic resin photoconverter by rolling, which includes: a cooperative roll-shaping and roll-cutting apparatus used for performing roll-shaping and roll-cutting on a photoconversion sheet, to form a photoconversion sheet array; and a roll-bonding apparatus used for performing roll-bonding on the photoconversion sheet array and a flip chip LED array, where the cooperative roll-shaping and roll-cutting apparatus and the roll-bonding apparatus are arranged sequentially to form cooperatively linked process equipment, the cooperative roll-shaping and roll-cutting apparatus includes a first rolling device with a protrusion array and a second rolling device with a recess array that are disposed face-to-face and aligned with each other, and the roll-bonding apparatus includes a fourth rolling device with a recess array and a third rolling device with a smooth rolling surface that are disposed face-to-face and aligned with each other.

It should be particularly noted that: the present invention is applicable to production and processing of a photoelectric device or an electronic device of a structure similar to that of a flip chip LED.

Figure 5A:
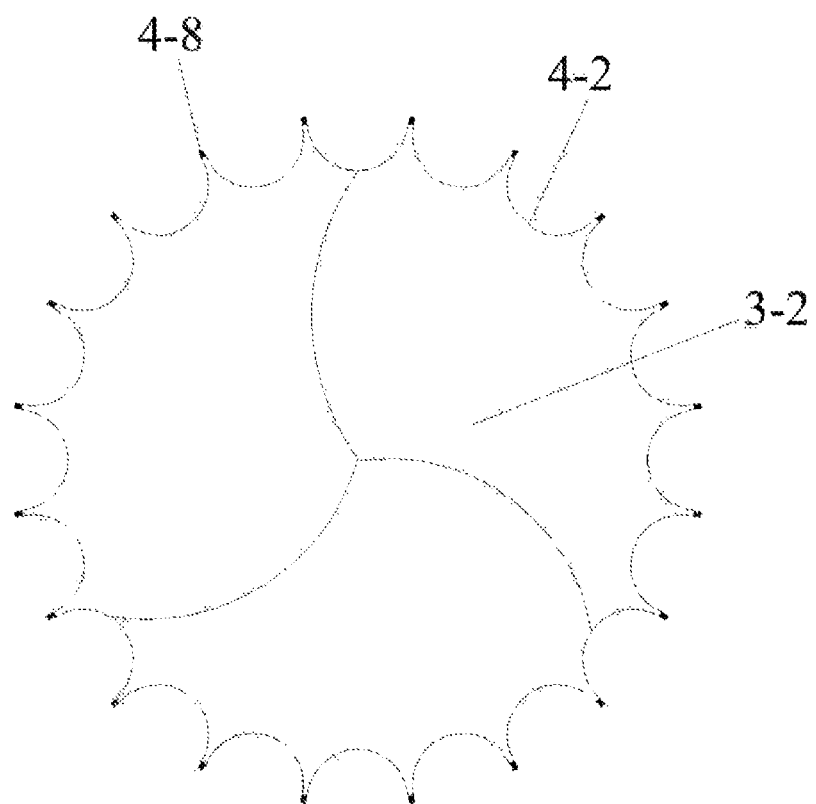
FIG. 5A is a schematic structural diagram of a cutting manner 1 in shaping and cutting of the photoconversion sheet array in the schematic structural diagram of the first flow layout shown in FIG. 2.
Figure 5B:
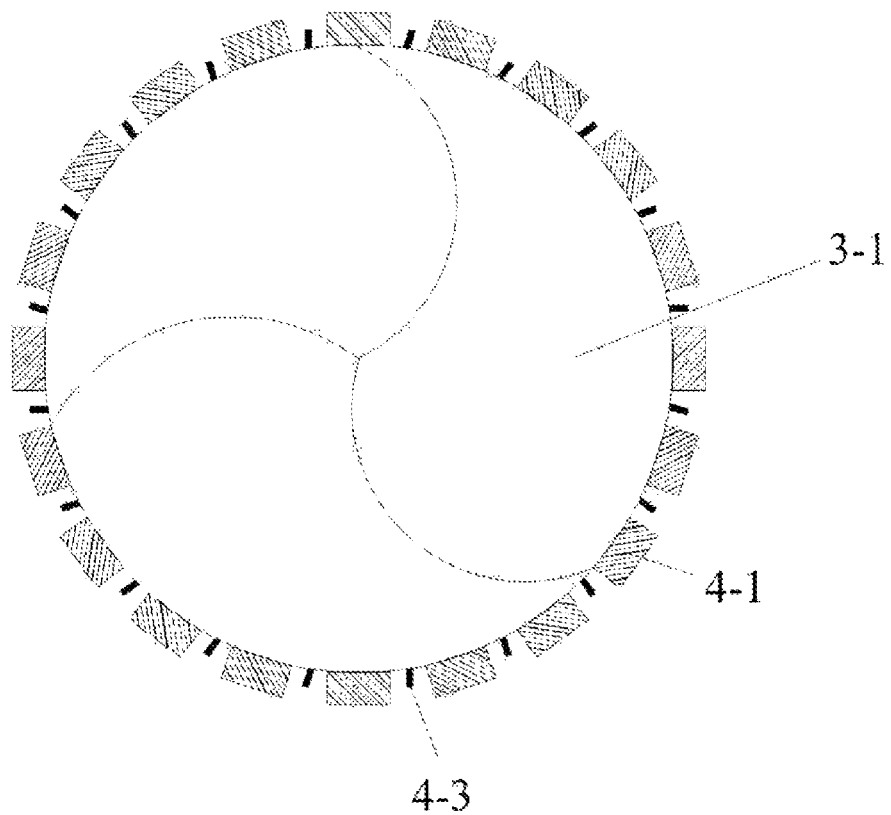

Further preferred solutions of the equipment system for bond-packaging an LED using a thermoplastic resin photo-converter by rolling according to the present invention are as follows:

In the cooperative roll-shaping and roll-cutting apparatus, cutters are provided at the peripheries of the protrusions in the protrusion array of the first rolling device and/or rims of the recesses in the recess array of the second rolling device, as shown in FIG. 5A and FIG. 5B.

The first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device with a protrusion array and the second rolling device with a recess array is a single-wheeled roller.

In the second single-wheeled roller with a recess array or the second planar conveyor with a recess array, a recess shape of the recess array is a cambered surface, a hemispheric surface, or a planar surface.

In the first single-wheeled roller with a protrusion array or the first planar conveyor with a protrusion array, the shape of a protrusion in the protrusion array is the same as that of a flip chip LED, and the length, width, and height of the protrusion are 1.01 to 1.05 times of those of the flip chip LED. The length, width, and height of the protrusion in the protrusion array rely on a rate of contraction of the thermoplastic resin. Preferably, the length, width, and height of the protrusion are 1.02 times of those of the flip chip LED.

The fourth rolling device with a recess array in the roll-bonding apparatus is a fourth single-wheeled roller with a recess array or a fourth planar conveyor with a recess array.

The third rolling device in the roll-bonding apparatus is a third single-wheeled roller with a smooth roll surface or a third planar conveyor with a smooth flat surface, at least one of the fourth rolling device and the third rolling device being a single-wheeled roller.

A recess shape of the recess array in the fourth single-wheeled roller or the fourth planar conveyor is the same as a recess shape of the recess array in the second single-wheeled roller or the second planar conveyor.

The second rolling device in the cooperative roll-shaping and roll-cutting apparatus and the fourth rolling device in the roll-bonding apparatus are the same device having dual functions.

It should be further noted that, the cooperative roll-shaping and roll-cutting apparatus and the roll-bonding apparatus are specifically implemented as follows:

When the first rolling device is the first singled-wheeled roller with a protrusion array, the second rolling device and the fourth rolling device are both the second singled-wheeled roller with a recess array, and the third rolling device is the third singled-wheeled roller with a smooth roll surface, structures of the cooperative roll-shaping and roll-cutting apparatus and the roll-bonding apparatus are as shown in FIG. 4, in this embodiment, the fourth single-wheeled roller with a recess array and the second single-wheeled roller with a recess array are the same device.

When the first rolling device is the first singled-wheeled roller with a protrusion array, the second rolling device is the second singled-wheeled roller with a recess array, the third rolling device is the third singled-wheeled roller with a smooth roll surface, and the fourth rolling device is the fourth singled-wheeled roller with a recess array, structures of the cooperative roll-shaping and roll-cutting apparatus and the roll-bonding apparatus are as shown in FIG. 7.

When the first rolling device is the first singled-wheeled roller with a protrusion array, the second rolling device and the fourth rolling device are both the second planar conveyor with a recess array, and the third rolling device is the third singled-wheeled roller with a smooth roll surface, structures of the cooperative roll-shaping and roll-cutting apparatus and the roll-bonding apparatus are as shown in FIG. 9. In this embodiment, the fourth planar conveyor with a recess array and the second planar conveyor with a recess array are the same device.

When the first rolling device is the first singled-wheeled roller with a protrusion array, the second rolling device is the second singled-wheeled roller with a recess array, the third rolling device is the third singled-wheeled roller with a smooth roll surface, and the fourth rolling device 4 is the fourth planar conveyor with a recess array, structures of the cooperative roll-shaping and roll-cutting apparatus and the roll-bonding apparatus are as shown in FIG. 11A and FIG. 11B respectively.

The planar conveyor is a device using two or more rollers to bear a planar conveyor belt and drive the belt to move ahead, where at least one of the rollers is driven by a motor. A material of the planar conveyor belt may be metal or non-metal with high temperature resistance and desirable strength properties.

The equipment system further includes a cooling and curing apparatus for fabricating finished LED package elements, where the cooling and curing apparatus is process equipment located at a rear end of the roll-bonding apparatus.

The cooling and curing apparatus is a tunnel-type multi-temperature zone apparatus provided with a temperature control component and a conveyor belt passage.

The equipment system further includes a double-roller roll-laminating apparatus for preparing a photoconversion sheet, where the double-roller roll-laminating apparatus is process equipment located at a front end of the cooperative roll-shaping and roll-cutting apparatus.

The double-roller roll-laminating apparatus includes a first smooth-surface double-roller roll laminator; and the first smooth-surface double-roller roll laminator includes two smooth-surface single-wheeled rollers each having a smooth rolling surface, the two smooth-surface single-wheeled rollers performing rolling face-to-face in alignment with each other.

The double-roller roll-laminating apparatus further includes a second smooth-surface double-roller roll laminator; and the second smooth-surface double-roller roll laminator includes two smooth-surface single-wheeled rollers each having a smooth rolling surface, the two smooth-surface single-wheeled rollers performing rolling face-to-face in alignment with each other.

A distance between two rollers of the first smooth-surface double-roller roll laminator is no more than 850 μm, and a distance between two rollers of the second smooth-surface double-roller roll laminator is no more than 800 μm.

It should be further noted that, a structure of the double-roller roll-laminating apparatus formed by the two smooth-surface single-wheeled rollers each having a smooth rolling surface and performing rolling face-to-face in alignment with each other of the first smooth-surface double-roller roll laminator and the two smooth-surface single-wheeled rollers each having a smooth rolling surface and performing rolling face-to-face in alignment with each other of the second smooth-surface double-roller roll laminator is as shown in FIG. 3.

The equipment system further includes a melting and blending apparatus for blending at least thermoplastic resin and a photoconversion material, and the melting and blending apparatus is process equipment located at a front end of the double-roller roll-laminating apparatus.

The melting and blending apparatus, the double-roller roll-laminating apparatus, the cooperative roll-shaping and roll-cutting apparatus, the roll-bonding apparatus, and the cooling and curing apparatus are cooperatively linked in sequence, to form flow-type continuous process equipment, as shown in FIGS. 2, 6, 8, and 10.

The equipment system for bond-packaging an LED using a thermoplastic resin photoconverter by rolling provided by the present invention is widely applicable to a new packaging process of bonding various thermoplastic resin photoconverters to LED clip chips of different power.

In Embodiment 2 below, the present invention is applied to a new process of for bond-packaging an LED using a thermoplastic resin photoconverter by rolling, and specific implementations of Embodiment 2 of the present invention are further described in detail.

Embodiment 2: As shown in FIGS. 1, 2, 6, 8, and 10, a process for bond-packaging an LED using a thermoplastic resin photoconverter by rolling, to which the equipment system of the present invention is applied, includes the following continuous process flow: preparation of a photoconversion sheet, shaping and cutting of a photoconversion sheet array, forming of LED package elements by bonding, and curing of the LED package elements. The process includes the following basic steps:

step 1: preparation of a photoconversion sheet: acquiring a photoconversion sheet formed by at least thermoplastic resin and a photoconversion material;

step 2: forming of a photoconversion sheet array by shaping and cutting: in a vacuum condition, performing roll-shaping and roll-cutting on the photoconversion sheet in step 1 cooperatively by using a first rolling device with a protrusion array and a second rolling device with a recess array that are disposed face-to-face and aligned with each other, to obtain a photoconversion sheet array formed by individual photoconversion sheets with recesses, a slit for separating the individual photoconversion sheets being formed between every two individual photoconversion sheets in the photoconversion sheet array;

step 3: forming of LED package elements by bonding: in a vacuum condition, performing roll-bonding on the photoconversion sheet array in step 2 and a flip chip LED array with a carrier sheet face-to-face in alignment with each other, such that flip chip LEDs in the flip chip LED array are bonded to and embedded in the recesses on the individual photoconversion sheets of the photoconversion sheet array, to obtain LED package elements, the flip chip LED referring to a single flip chip LED or a flip chip LED assembly, and the flip chip LED assembly being composed of two or more flip chip LEDs; and step 4: curing of the LED package elements: in a vacuum condition, curing the LED package elements by cooling, such that the photoconversion sheets bonded to the flip chip LED array contract and naturally close up, to obtain finished LED package elements.

As required, a stretcher may be used to stretch a stretchable carrier sheet of the finished LED package elements in step 4, such that the finished LED package elements are split along the slits after being stretched, to obtain finished individual LED package elements, as shown in FIG. 12A and FIG. 12B. Refer to FIGS. 13A, 13B and 13C for the shape of the finished individual LED package elements.

Specific implementation steps of the process for bund-packaging an LED using a thermoplastic resin photoconverter by rolling are further disclosed as follows, where the equipment system of the present invention is applied to the process:

The preparation of a photoconversion sheet in step 1 refers to, rolling mixed slurry containing at least the thermoplastic resin and the photoconversion material by using a smooth-surface double roller in a vacuum heating condition, to obtain the photoconversion sheet. The rolling the mixed slurry by using a smooth-surface double roller to obtain the photoconversion sheet refers to: first rolling and molding the mixed slurry by using a first smooth-surface double-roller roll laminator, to obtain a rough photoconversion sheet; and then rolling and molding the molded rough photoconversion sheet by using a second smooth-surface double-roller roll laminator, to obtain a refined photoconversion sheet. The thickness of the rough photoconversion sheet is no more than 850 μm, and the thickness of the refined photoconversion sheet is no more than 800 μm. The rolling the mixed slurry by using a smooth-surface double roller to obtain the photoconversion sheet refers to: rolling and molding the mixed slurry by using three or more sets of double rollers, to obtain a refined photoconversion sheet, the thickness of the refined photoconversion sheet being below 800 μm. The temperature of the mixed slurry ranges from 180° C. to 320°

C. An optimal temperature of the mixed slurry ranges from 240° C. to 280° C. The photoconversion material is a quantum dot fluorophor, and the photoconversion sheet is a quantum dot fluorophor sheet. The photoconversion material is fluorescent powder, and the photoconversion sheet is a fluorophor sheet. Materials of the mixed slurry may further include an adhesive.

Step 2 of performing roll-shaping and roll-cutting on the photoconversion sheet cooperatively by using a first rolling device with a protrusion array and a second rolling device with a recess array that are disposed face-to-face and aligned with each other refers to: performing roll-shaping and roll-cutting on the photoconversion sheet simultaneously by using the first rolling device with a protrusion array and the second rolling device with a recess array that are disposed face-to-face and aligned with each other, that is, simultaneously carrying out roll-shaping and roll-cutting, to achieve the two functions at the same time.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping on the photoconversion sheet by using the first rolling device with a protrusion array and the second rolling device with a recess array, to obtain a photoconversion sheet array formed by individual photoconversion sheets with recesses. Cutters are provided on the periphery with protrusions of the protrusion array and/or the rims of recesses of the recess array, such that roll-cutting for forming a slit is performed on the photoconversion sheet while roll-shaping is performed, to form slits for separating the individual photoconversion sheets.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by, using a double-roller rolling device with both a protrusion array and a recess array, the first rolling device with a protrusion array being a first single-wheeled roller with a protrusion array in the double-roller rolling device, the second rolling device with a recess array being a second single-wheeled roller with a recess array in the double-roller rolling device, and cutters being provided on the periphery with protrusions of the first single-wheeled roller with a protrusion array and/or the rims of recesses of the second single-wheeled roller with a recess array, as shown in FIG. 5A and FIG. 5B.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first single-wheeled roller with a protrusion array and a second planar conveyor with a recess array, the first rolling device with a protrusion array being the first single-wheeled roller with a protrusion array, the second rolling device with a recess array being the second planar conveyor with a recess array, and cutters being provided on the periphery with protrusions of the first single-wheeled roller with a protrusion array and/or the rims of recesses of the second planar conveyor with a recess array.

Step 2 of performing roll-shaping and roll-cutting on the photoconversion sheet simultaneously by using a first rolling device with a protrusion array and a second rolling device with a recess array that are disposed face-to-face and aligned with each other refers to: performing roll-shaping and roll-cutting on the photoconversion sheet simultaneously by using a first planar conveyor with a protrusion array and a second single-wheeled roller with a recess array, the first rolling device with a protrusion array being the first planar conveyor with a protusion array, the second rolling device with a recess array being the second single-wheeled roller with a recess array, and cutters being provided on the periphery with protrusions of the first planar conveyor with a protrusion array and/or the rims of recesses of the second single-wheeled roller with a recess array.

In step 2, the shape of each photoconversion sheet in the photoconversion sheet array formed by individual photoconversion sheets with recesses is a cambered surface, a hemispheric surface, or a planar surface. The temperature of cooperate roll-shaping and roll-cutting ranges from 120° C. to 250° C. The depth of the slit is 50% to 100% of the thickness of the refined photoconversion sheet. The depth of the slit is 70% to 80% of the thickness of the refined photoconversion sheet. The width of the slit is below 20 μm. The length, width, and height of a recess on the photoconversion sheet array formed by individual photoconversion sheets with recesses are 1.01 to 1.05 times of those of a flip chip LED.

The roll-bonding in step 3 refers to: arranging the photoconversion sheet array on a fourth single-wheeled roller with a recess array or a fourth planar conveyor with a recess array, arranging the flip chip LED array with the carrier sheet on a third single-wheeled roller with a smooth rolling surface or a third planar conveyor with a smooth flat surface, and then performing roll-bonding, such that the flip chip LEDs in the flip chip LED array are bonded to and embedded in the recesses on the individual photoconversion sheets of the photoconversion sheet array, to obtain the LED package elements, at least one of the device arranged with the photoconversion sheet array and the device arranged with the flip chip LED array being a single-wheeled roller.

In step 3, the temperature of the roll-bonding ranges from 120° C. to 250° C. The carrier film in the flip chip LED array with the carrier sheet is a stretchable carrier film. A material of the extensible carrier sheet is one of heat-resistant polyester, polydimethylsiloxane, and polyvinyl chloride.

It should be further noted that, specific implementations of the cooperative roll-shaping and roll-cutting and the roll-bonding in step 2 are as follows:

Refer to FIG. 4 for processes of performing roll-shaping and roll-cutting on the photoconversion sheet simultaneously by using the first single-wheeled roller with a protrusion array and the second single-wheeled roller with a recess array, and performing roll-bonding by using the second single-wheeled roller with a recess array and the third single-wheeled roller with a smooth surface to implement LED packaging, the flip chip LED array with the carrier sheet being arranged on the third single-wheeled roller. In this embodiment, the fourth single-wheeled roller with a recess array and the second single-wheeled roller with a recess array are the same device.

Refer to FIG. 7 for processes of performing roll-shaping and roll-cutting on the photoconversion sheet simultaneously by using the first single-wheeled roller with a protrusion array and the second single-wheeled roller with a recess array, and performing roll-bonding by using the fourth single-wheeled roller with a recess array and the third single-wheeled roller with a smooth surface to implement LED packaging, the flip chip LED array with the carrier sheet being arranged on the third single-wheeled roller.

Refer to FIG. 9 for processes of performing roll-shaping and roll-cutting on the photoconversion sheet simultaneously by using the first single-wheeled roller with a protrusion array and the second planar conveyor with a recess array, and performing roll-bonding by using the second planar conveyor with a recess array and the third single-wheeled roller with a smooth surface to implement LED packaging, the flip chip LED array with the carrier sheet being arranged on the third single-wheeled roller. In this embodiment, the fourth planar conveyor with a recess array and the second planar conveyor with a recess array are the same device.

Refer to FIG. 11A and FIG. 11B for processes of performing roll-shaping and roll-cutting on the photoconversion sheet simultaneously by using the first single-wheeled roller with a protrusion array and the second single-wheeled roller with a recess array, and performing roll-bonding by using the first planar conveyor with a recess array and the third single-wheeled roller with a smooth surface to implement LED packaging, the flip chip LED array with the carrier sheet being arranged on the third single-wheeled roller.

The curing by cooling in step 4 is curing by gradient cooling or curing by steady cooling. The curing by gradient cooling refers to decreasing the temperature of the LED package elements to room temperature along several gradients, duration of the curing by cooling being 3 min to 10 min, and duration of each stage of the curing by cooling being adjustable. The curing by steady cooling refers to decreasing the temperature of the LED package elements to room temperature steadily, duration of the curing by cooling being 3 min to 10 min.

Any description not involved in the specific implementations of the present invention belongs to well-known technologies in the art and can be implemented with reference to the well-known technologies.

The present invention gains a satisfactory trial result after repeated test and verification. The foregoing specific implementations and embodiments give a specific support for a technical idea of an equipment system for bond-packaging an LED using a thermoplastic resin photoconverter by rolling according to the present invention, and are not intended to limit the protection scope of the present invention. Any equivalent changes or modifications made on the basis of the technical solutions and according to the technical idea proposed in the present invention still fail within the protection scope of the technical solutions of the present invention.

What is claimed is:

1. An equipment system for bond-packaging an LED using a thermoplastic resin photoconverter by rolling, comprising:
   a cooperative roll-shaping and roll-cutting apparatus used for performing roll-shaping and roll-cutting on a photoconversion sheet, to form a photoconversion sheet array; and
   a roll-bonding apparatus used for performing roll-bonding on the photoconversion sheet array and a flip chip LED array, wherein the cooperative roll-shaping and roll-cutting apparatus and the roll-bonding apparatus are arranged sequentially to form cooperatively linked process equipment, the cooperative roll-shaping and roll-cutting apparatus comprises a first rolling device with a protrusion array and a second rolling device with a recess array that are disposed face-to-face and aligned with each other, and the roll-bonding apparatus comprises a fourth rolling device with a recess array and a third rolling device with a smooth rolling surface that are disposed face-to-face and aligned with each other, wherein cutters are provided at the peripheries of the protrusions in the protrusion array of the first rolling device and/or rims of the recesses in the recess array of the second rolling device.

2. The equipment system for bond-packaging an LED using a thermoplastic resin photoconverter by rolling according to claim 1, wherein the first rolling device with a protrusion array is a first single-wheeled roller with a protrusion array or a first planar conveyor with a protrusion array; the second rolling device with a recess array is a second single-wheeled rover with a recess array or a second planar conveyor with a recess array; and at least one of the first rolling device with a protrusion array and the second rolling device with a recess array is a single-wheeled roller.

3. The equipment system for bond-packaging an LED using a thermoplastic resin photoconverter by rolling according to claim 2, wherein a recess shape of the recess array in the second single-wheeled roller with a recess array or the second planar conveyor with a recess array is a cambered surface, a hemispheric surface, or a planar surface.

4. The equipment system for bond-packaging an LED using a thermoplastic resin photoconverter by rolling according to claim 3, wherein in the first single-wheeled roller with a protrusion array or the first planar conveyor with a protrusion array, the shape of the protrusion in the protrusion array is the same as the flip chip LED, and the length, width, and height of the protrusion are 1.01 to 1.05 times of those of the flip chip LED.

5. The equipment system for bond-packaging an LED using a thermoplastic resin photoconverter by rolling according to claim 1, wherein
   the fourth rolling device with a recess array in the roll-bonding apparatus is a fourth single-wheeled roller with a recess array or a fourth planar conveyor with a recess array;
   the third rolling device in the roll-bonding apparatus is a third single-wheeled roller with a smooth roll surface or a third planar conveyor with a smooth flat surface, at least one of the fourth rolling device and the third rolling device being a single-wheeled roller; and
   a recess shape of the recess array in the fourth single-wheeled roller or the fourth planar conveyor is the same as the recess shape of the recess array in the second single-wheeled roller or the second planar conveyor.

6. The equipment system for bond-packaging an LED using a thermoplastic resin photoconverter by rolling according to claim 5, wherein the second rolling device in the cooperative roll-shaping and roll-cutting apparatus and the fourth rolling device in the roll-bonding apparatus are the same device having dual functions.

7. The equipment system for bond-packaging an LED using a thermoplastic resin photoconverter by rolling according to claim 5, wherein the planar conveyor is a device using two or more rollers to bear a planar conveyor belt and drive the belt to move ahead, at least one of the rollers being driven by a motor.

8. The equipment system for bond-packaging an LED using a thermoplastic resin photoconverter by rolling according to claim 1, wherein the equipment system further comprises a cooling and curing apparatus for fabricating finished LED package elements, and the cooling and curing apparatus is process equipment located at a rear end of the roll-bonding apparatus.

9. The equipment system for bond-packaging an LED using a thermoplastic resin photoconverter by rolling according to claim 5, wherein the equipment system further comprises a cooling and curing apparatus for fabricating finished LED package elements, and the cooling and curing apparatus is process equipment located at a rear end of the roll-bonding apparatus.

10. The equipment system for bond-packaging an LED using a thermoplastic resin photoconverter by rolling according to claim 8, wherein the cooling and curing apparatus is a tunnel-type multi-temperature zone apparatus provided with a temperature control component and a conveyor belt passage.

11. The equipment system for bond-packaging an LED using a thermoplastic resin photoconverter by rolling according to claim 10, wherein
the equipment system further comprises a double-roller roll-laminating apparatus for preparing a photoconversion sheet, wherein the double-roller roll-laminating apparatus is process equipment located at a front end of the cooperative roll-shaping and roll-cutting apparatus; and
the double-roller roll-laminating apparatus comprises a first smooth-surface double-roller roll laminator that comprises two smooth-surface single-wheeled rollers each having a smooth rolling surface, the two smooth-surface single-wheeled rollers performing rolling face-to-face in alignment with each other.

12. The equipment system for bond-packaging an LED using a thermoplastic resin photoconverter by rolling according to claim 11, wherein the double-roller roll-laminating apparatus further comprises a second smooth-surface double-roller roll laminator, and the second smooth-surface double-roller roll laminator comprises two smooth-surface single-wheeled rollers each having a smooth rolling surface, the two smooth-surface single-wheeled rollers performing rolling face-to-face in alignment with each other.

13. The equipment system for bond-packaging an LED using a thermoplastic resin photoconverter by rolling according to claim 12, wherein a distance between two rollers of the first smooth-surface double-roller roll laminator is no more than 850 μm, and a distance between two rollers of the second smooth-surface double-roller roll laminator is no more than 800 μm.

14. The equipment system for bond-packaging an LED using a thermoplastic resin photoconverter by rolling according to claim 11, wherein the equipment system further comprises a melting and blending apparatus for blending at least a thermoplastic resin and a photoconversion material, and the melting and blending apparatus is process equipment located at a front end of the double-roller roll-laminating apparatus.

15. The equipment system for bond-packaging an LED using a thermoplastic resin photoconverter by rolling according to claim 14, wherein the melting and blending apparatus, the double-roller roll-laminating apparatus, the cooperative roll-shaping and roll-cutting apparatus, the roll-bonding apparatus, and the cooling and curing apparatus are cooperatively linked in sequence, to form flow-type continuous process equipment.

* * * * *